(12) United States Patent
Mizugaki et al.

(10) Patent No.: US 12,494,399 B2
(45) Date of Patent: Dec. 9, 2025

(54) METHOD FOR MANUFACTURING SEMICONDUCTOR DEVICE

(71) Applicant: SEIKO EPSON CORPORATION, Tokyo (JP)

(72) Inventors: Koichi Mizugaki, Suwa (JP); Tomoyuki Kamakura, Matsumoto (JP); Yasuke Matsuzawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 377 days.

(21) Appl. No.: 18/339,567

(22) Filed: Jun. 22, 2023

(65) Prior Publication Data

US 2023/0420299 A1 Dec. 28, 2023

(30) Foreign Application Priority Data

Jun. 27, 2022 (JP) .................. 2022-102436

(51) Int. Cl.
*H01L 21/768* (2006.01)
*H01L 21/311* (2006.01)
*H01L 23/48* (2006.01)

(52) U.S. Cl.
CPC .. *H01L 21/76898* (2013.01); *H01L 21/31111* (2013.01); *H01L 23/481* (2013.01)

(58) Field of Classification Search
CPC ......... H01L 21/76898; H01L 21/31111; H01L 23/481; H01L 21/76802
See application file for complete search history.

(56) References Cited

U.S. PATENT DOCUMENTS

| 8,621,926 | B2 * | 1/2014 | Yoda | H01L 21/76898 257/774 |
| 9,126,824 | B2 * | 9/2015 | Saito | B81B 7/0035 |
| 9,437,489 | B2 * | 9/2016 | Yoda | H01L 23/481 |
| 9,659,841 | B2 * | 5/2017 | Nomura | H01L 23/5283 |
| 10,043,743 | B2 * | 8/2018 | Nomura | H01L 23/53238 |
| 10,580,732 | B2 * | 3/2020 | Nomura | H01L 23/481 |
| 2007/0241457 | A1 * | 10/2007 | Ida | H01L 21/76898 257/E21.597 |

(Continued)

FOREIGN PATENT DOCUMENTS

| CN | 101800240 | A | * | 8/2010 | .......... H10K 59/878 |
| CN | 102686018 | A | * | 9/2012 | .......... H10F 77/206 |

(Continued)

*Primary Examiner* — Laura M Menz
(74) *Attorney, Agent, or Firm* — Rankin, Hill & Clark LLP

(57) ABSTRACT

A method for manufacturing a semiconductor device includes: forming a first through hole penetrating from a first surface to a second surface of a semiconductor substrate; forming a second insulating film at the first surface of the semiconductor substrate and a side surface of the first through hole; disposing a resist at a surface of the second insulating film from the first surface of the semiconductor substrate to an end portion of the side surface of the first through hole on a first surface side of the semiconductor substrate; wet-etching the second insulating film by using the resist as a mask; covering the first surface of the semiconductor substrate and the side surface of the first through hole with an organic insulating film; and forming a second conductive film at a surface of the organic insulating film.

5 Claims, 9 Drawing Sheets

(56) References Cited

U.S. PATENT DOCUMENTS

| | | | |
|---|---|---|---|
| 2011/0271757 A1* | 11/2011 | Yoda | G01C 19/5776 |
| | | | 174/265 |
| 2012/0069425 A1* | 3/2012 | Sato | G02F 1/167 |
| | | | 359/296 |
| 2013/0313688 A1* | 11/2013 | Nomura | H01L 21/76898 |
| | | | 257/621 |
| 2014/0082936 A1* | 3/2014 | Yoda | B81B 7/0006 |
| | | | 29/837 |
| 2014/0231934 A1* | 8/2014 | Saito | B81C 1/00277 |
| | | | 438/51 |
| 2014/0299881 A1* | 10/2014 | Oda | H10D 86/60 |
| | | | 438/151 |
| 2015/0115412 A1* | 4/2015 | Nomura | H01L 23/5226 |
| | | | 257/621 |
| 2015/0221684 A1* | 8/2015 | Kanda | H10D 86/451 |
| | | | 438/666 |
| 2015/0284242 A1* | 10/2015 | Saito | B81B 7/0035 |
| | | | 257/415 |
| 2017/0200644 A1* | 7/2017 | Aoyagi | H01L 21/76895 |
| 2017/0221817 A1* | 8/2017 | Nomura | H01L 21/76898 |
| 2018/0108625 A1* | 4/2018 | Hosokawa | H01L 23/522 |
| 2018/0315705 A1* | 11/2018 | Nomura | H01L 21/02118 |
| 2020/0058843 A1* | 2/2020 | Mizugaki | H03H 9/19 |
| 2020/0312890 A1* | 10/2020 | Oikawa | H10D 30/6723 |
| 2022/0239274 A1* | 7/2022 | Matsuzawa | H03H 9/0557 |
| 2023/0292441 A1* | 9/2023 | Kitahara | H05K 3/107 |
| 2023/0420299 A1* | 12/2023 | Mizugaki | H01L 23/481 |
| 2024/0258202 A1* | 8/2024 | Matsuzawa | H01L 23/481 |
| 2025/0239988 A1* | 7/2025 | Matsuzawa | H03H 9/1021 |

FOREIGN PATENT DOCUMENTS

| | | | | |
|---|---|---|---|---|
| CN | 104600024 B | * | 12/2019 | ....... H01L 21/76898 |
| CN | 112019164 A | * | 12/2020 | ............... H03B 5/36 |
| CN | 117316865 A | * | 12/2023 | ....... H01L 21/76898 |
| CN | 110534492 B | * | 2/2024 | ....... H01L 21/76898 |
| CN | 118412323 A | * | 7/2024 | ....... H01L 21/76898 |
| JP | H08335675 A | * | 12/1996 | |
| JP | 2005150354 A | | 6/2005 | |
| JP | 2007053149 A | * | 3/2007 | ............ H01L 23/481 |
| JP | 2007305960 A | * | 11/2007 | ............. H01L 24/02 |
| JP | 2014155980 A | * | 8/2014 | ........... B81B 7/0054 |
| JP | 2015088618 A | * | 5/2015 | ....... H01L 21/76898 |
| JP | 6309243 B2 | * | 4/2018 | ......... H01L 23/5283 |
| JP | 2018-113466 A | | 7/2018 | |
| JP | 2019-87768 A | | 6/2019 | |
| JP | 2019087768 A | * | 6/2019 | |
| JP | 2024003354 A | * | 1/2024 | ....... H01L 21/76898 |
| KR | 20090002644 A | * | 1/2009 | ............. H01L 23/12 |
| WO | WO-2012133807 A1 | * | 10/2012 | ......... H10K 59/8794 |
| WO | 2016/159320 A1 | | 10/2016 | |
| WO | WO-2010047264 A1 | * | 4/2019 | ............... G03F 7/16 |

\* cited by examiner

METHOD FOR MANUFACTURING SEMICONDUCTOR DEVICE

The present application is based on, and claims priority from JP Application Serial Number 2022-102436, filed Jun. 27, 2022, the disclosure of which is hereby incorporated by reference herein in its entirety.

BACKGROUND

1. Technical Field

The present disclosure relates to a method for manufacturing a semiconductor device.

2. Related Art

JP-A-2018-113466 discloses a method for manufacturing a semiconductor device including a silicon substrate having a through hole penetrating from one main surface to the other main surface on a side opposite to the one main surface, a CVD oxide film provided on a side surface of the through hole, an organic insulating film provided on the CVD oxide film, an Al film exposed at a bottom portion of the through hole, and a through silicon via provided on the organic insulating film and coupled to the Al film. The Al film is used as, for example, a device pad for coupling the semiconductor device.

However, in the method for manufacturing a semiconductor device disclosed in JP-A-2018-113466, a film thickness of the CVD oxide film provided on the side surface of the through hole tends to decrease toward the bottom portion of the through hole. This tendency becomes more remarkable as an aspect ratio of the through hole increases. To form a through hole having a large aspect ratio, a Bosch method is used. When the through hole is formed by using the Bosch method, scallops are formed on the side surface of the through hole, and therefore the film thickness of the CVD oxide film provided on the side surface of the through hole is more likely to be non-uniform. Therefore, adhesion of the CVD oxide film provided on the side surface of the through hole to the side surface of the through hole tends to decrease toward the bottom portion of the through hole. Since the CVD oxide film provided on the side surface close to the bottom portion of the through hole has low adhesion to the side surface of the through hole, the CVD oxide film may fall off during a manufacturing process of the semiconductor device and adhere to the Al film exposed at the bottom portion of the through hole.

When the CVD oxide film falls off to the Al film, there is a problem that electrical coupling between the Al film and the through silicon via becomes unstable, and a yield of the semiconductor device decreases.

SUMMARY

A method for manufacturing a semiconductor device includes: disposing a first insulating film and a first conductive film in this order at a second surface of a semiconductor substrate having a first surface and the second surface; forming a first through hole penetrating from the first surface to the second surface of the semiconductor substrate to expose the first insulating film disposed at the second surface from the first through hole; forming a second insulating film at the first surface of the semiconductor substrate and a side surface of the first through hole; disposing a resist at a surface of the second insulating film from the first surface of the semiconductor substrate to an end portion of the side surface of the first through hole on a first surface side of the semiconductor substrate; wet-etching the first insulating film and the second insulating film by using the resist as a mask and forming a second through hole continuous with the first through hole in the first insulating film; covering the first surface of the semiconductor substrate, the side surface of the first through hole, a side surface of the second through hole, and a surface of the first conductive film exposed from the second through hole with an organic insulating film; forming an opening for exposing the first conductive film in the organic insulating film; and forming a second conductive film at a surface of the organic insulating film and the surface of the first conductive film exposed from the opening formed in the organic insulating film.

DESCRIPTION OF EXEMPLARY EMBODIMENTS

1. First Embodiment

A semiconductor device 1 according to a first embodiment will be described with reference to FIG. 1.

Figure 1:
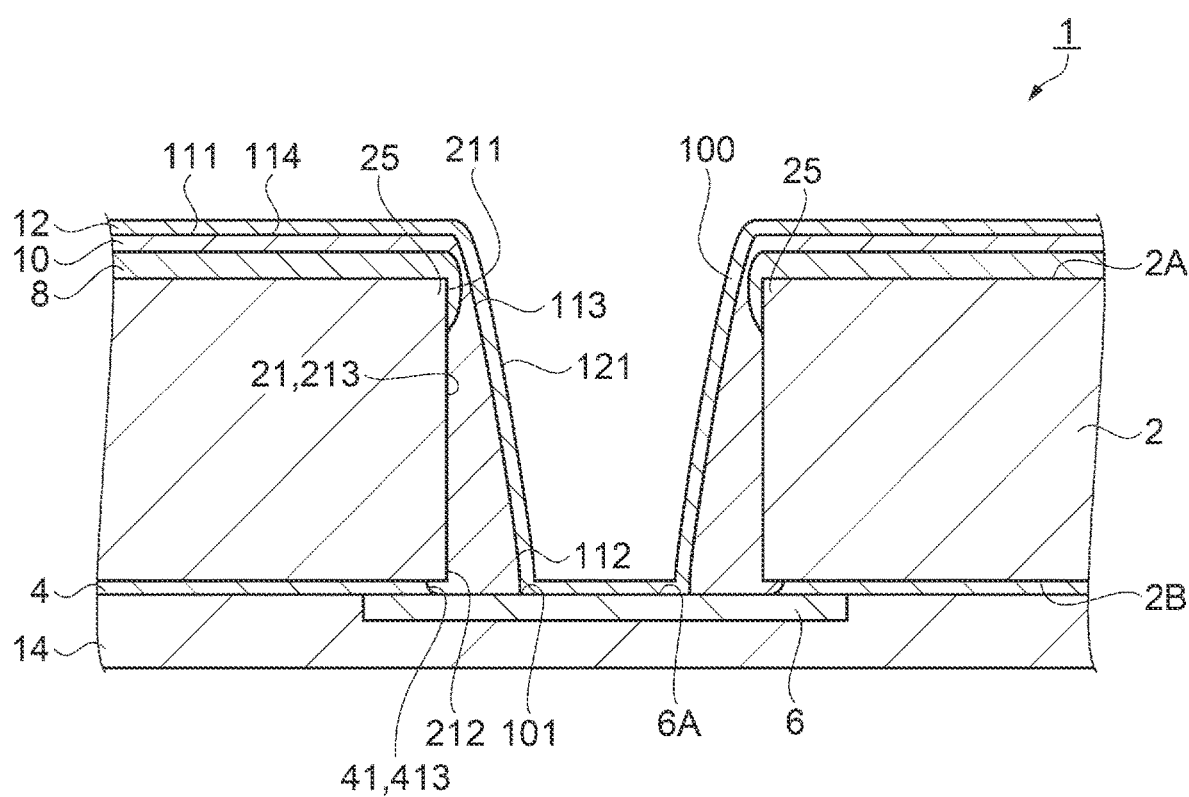
FIG. 1 is a cross-sectional view of a semiconductor device according to a first embodiment.

As shown in FIG. 1, the semiconductor device 1 includes a semiconductor substrate 2, a first insulating film 4, a first conductive film 6, a second insulating film 8, an organic insulating film 10, and a second conductive film 12.

The semiconductor substrate 2 has an upper surface 2A as a first surface and a lower surface 2B as a second surface having a front and back relationship with the upper surface 2A. In the present embodiment, the semiconductor substrate 2 is made of silicon. A material constituting the semiconductor substrate 2 is not limited to silicon, and for example, the semiconductor substrate 2 may be made of germanium or gallium nitride.

The semiconductor substrate 2 further has a first through hole 21 penetrating from the upper surface 2A to the lower surface 2B. The first through hole 21 has a first opening 211 opening in the upper surface 2A of the semiconductor substrate 2, a second opening 212 opening in the lower surface 2B of the semiconductor substrate 2, and a side surface 213 coupling the first opening 211 and the second opening 212. In the present embodiment, the side surface 213 is formed parallel to a thickness direction of the semiconductor substrate 2. The thickness direction of the semiconductor substrate 2 is a direction from the upper surface 2A to the lower surface 2B of the semiconductor substrate 2.

The semiconductor substrate 2 further includes a circuit (not shown) including an active element such as a transistor. In the present embodiment, the circuit is provided at the lower surface 2B of the semiconductor substrate 2.

The first insulating film 4 is disposed at the lower surface 2B of the semiconductor substrate 2. The first insulating film 4 covers the circuit (not shown) provided at the lower surface 2B of the semiconductor substrate 2. In the present embodiment, the first insulating film 4 is made of silicon oxide. A material constituting the first insulating film 4 is not limited to silicon oxide. For example, the first insulating film 4 may be made of silicon nitride.

The first insulating film 4 has a second through hole 41 penetrating from an upper surface of the first insulating film 4 to a lower surface of the first insulating film 4.

The second through hole 41 is provided at a position communicating with the first through hole 21 of the semiconductor substrate 2. Specifically, the second through hole 41 is located below the first through hole 21 and is provided to be continuous with the first through hole 21.

The first conductive film 6 is disposed at the lower surface of the first insulating film 4. That is, the first conductive film 6 is disposed at the lower surface 2B of the semiconductor substrate 2 via the first insulating film 4. In other words, the semiconductor substrate 2, the first insulating film 4, and the first conductive film 6 are disposed in this order.

Specifically, the first conductive film 6 is disposed below the second through hole 41 of the first insulating film 4. The first conductive film 6 covers the second opening 212 of the first through hole 21 of the semiconductor substrate 2 via the second through hole 41.

The first conductive film 6 is electrically coupled to the circuit (not shown) provided at the lower surface 2B of the semiconductor substrate 2 via a wiring (not shown). The first conductive film 6 is used as an electrode pad for coupling the circuit and an outside of the semiconductor device 1.

In the present embodiment, the first conductive film 6 is made of aluminum. A material constituting the first conductive film 6 is not limited to aluminum. For example, the first conductive film 6 may be made of copper.

The second insulating film 8 is disposed from the upper surface 2A of the semiconductor substrate 2 to an end portion of the semiconductor substrate 2 on an upper surface 2A side in the side surface 213 of the first through hole 21. In other words, the second insulating film 8 is disposed to cover a shoulder portion 25 of the first through hole 21. The shoulder portion 25 is a corner portion where the upper surface 2A of the semiconductor substrate 2 and the side surface 213 of the first through hole 21 intersect with each other.

In the present embodiment, the second insulating film 8 is made of silicon oxide. A material constituting the second insulating film 8 is not limited to silicon oxide. For example, the second insulating film 8 may be made of silicon nitride.

The organic insulating film 10 is continuously disposed at the upper surface 2A of the semiconductor substrate 2, the side surface 213 of the first through hole 21, a side surface 413 of the second through hole 41, and an upper surface 6A of the first conductive film 6 that is a surface of the first conductive film 6. The second insulating film 8 is disposed between the organic insulating film 10 and the upper surface 2A of the semiconductor substrate 2, and between the organic insulating film 10 and the end portion of the semiconductor substrate 2 on the upper surface 2A side in the side surface 213 of the first through hole 21.

The organic insulating film 10 has an opening 101 in a surface coupled to the upper surface 6A of the first conductive film 6.

The organic insulating film 10 further has a surface 111. The surface 111 of the organic insulating film 10 is a surface of the organic insulating film 10 at which the second conductive film 12 to be described later is disposed, and is a surface on a side opposite to a surface facing the upper surface 2A of the semiconductor substrate 2, the side surface 213 of the first through hole 21, and the side surface 413 of the second through hole 41. The surface 111 of the organic insulating film 10 has a first surface 112, a second surface 113, and a third surface 114. The first surface 112 and the second surface 113 are the surface 111 of the organic insulating film 10 inside the first through hole 21. The third surface 114 is the surface 111 of the organic insulating film 10 outside the first through hole 21.

The first surface 112 is a region of the surface 111 of the organic insulating film 10 from the opening 101 of the organic insulating film 10 toward the upper surface 2A side of the semiconductor substrate 2. The second surface 113 is a region of the surface 111 of the organic insulating film 10 located above the first surface 112 and extending from the first opening 211 of the first through hole 21 toward a lower surface 2B side of the semiconductor substrate 2. The third surface 114 is a region of the surface 111 of the organic insulating film 10 disposed at the upper surface 2A of the semiconductor substrate 2.

The third surface 114 is coupled to an end portion of the second surface 113 on a first opening 211 side. An end portion of the semiconductor substrate 2 on the lower surface 2B side in the second surface 113 is coupled to an end portion of the semiconductor substrate 2 on the upper surface 2A side in the first surface 112. An end portion of the first surface 112 on an opening 101 side is coupled to the upper surface 6A of the first conductive film 6.

In the present embodiment, the first surface 112 and the second surface 113 of the organic insulating film 10 are continuously coupled to each other. The first surface 112 and the second surface 113 of the organic insulating film 10 have a tapered shape that gradually narrows from the upper surface 2A toward the lower surface 2B of the semiconductor substrate 2. That is, the surface 111 of the organic insulating film 10 inside the first through hole 21, that is, the first surface 112 and the second surface 113 of the organic insulating film 10 has the tapered shape that gradually narrows from the upper surface 2A toward the lower surface 2B of the semiconductor substrate 2.

The surface 111 of the organic insulating film 10 may further have a relay surface (not shown) between the first surface 112 and the second surface 113 inside the first through hole 21. That is, the first surface 112 and the second surface 113 may be coupled to each other via the relay surface disposed between the first surface 112 and the second surface 113. The relay surface may not have a tapered shape. For example, the relay surface may be parallel to the thickness direction of the semiconductor substrate 2.

In the present embodiment, the organic insulating film 10 is made of an epoxy resin. A resin material constituting the organic insulating film 10 is not limited to an epoxy resin. For example, the organic insulating film may be made of a polyimide resin or an acrylic resin.

The second conductive film 12 is disposed at the surface 111 of the organic insulating film 10 and the upper surface 6A of the first conductive film 6. The second conductive film 12 is electrically coupled to the first conductive film 6 at the upper surface 6A of the first conductive film 6.

Specifically, the second conductive film 12 is disposed to cover the first surface 112 and the second surface 113 of the organic insulating film 10 and the upper surface 6A of the first conductive film 6 exposed from the opening 101 of the organic insulating film 10 inside the first through hole 21. By covering the first surface 112 and the second surface 113 of the organic insulating film and the upper surface 6A of the first conductive film 6 with the second conductive film 12, a recess 121 surrounded by the second conductive film 12 is formed inside the first through hole 21. The recess 121 has an opening on the upper surface 2A side of the semiconductor substrate 2. Further, the second conductive film 12 is disposed to cover the third surface 114 of the organic insulating film 10 outside the first through hole 21. In this way, the second conductive film 12 functions as a through electrode 100 penetrating the semiconductor substrate 2.

In the present embodiment, the second conductive film 12 is a metal film including a barrier layer (not shown) and a metal layer (not shown) stacked on the barrier layer. The barrier layer is made of an alloy of titanium and tungsten. The metal layer is made of copper. A material constituting the second conductive film 12 is not limited to the above-described materials. For example, the barrier layer may be made of an alloy of titanium and nickel, and the metal layer may be made of aluminum. Further, the barrier layer may be not provided.

In the present embodiment, the semiconductor device 1 further includes a third insulating film 14.

The third insulating film 14 is disposed at the lower surface of the first insulating film 4 via the first conductive film 6. In the present embodiment, the third insulating film 14 is made of silicon oxide. A material constituting the third insulating film 14 is not limited to silicon oxide. For example, the third insulating film 14 may be made of silicon nitride.

The semiconductor device 1 is described above.

Next, a method for manufacturing the semiconductor device 1 according to the present embodiment will be described with reference to FIGS. 2 to 13. Steps shown in FIGS. 2 to 13 are performed by, for example, a manufacturing apparatus (not shown).

Figure 2:
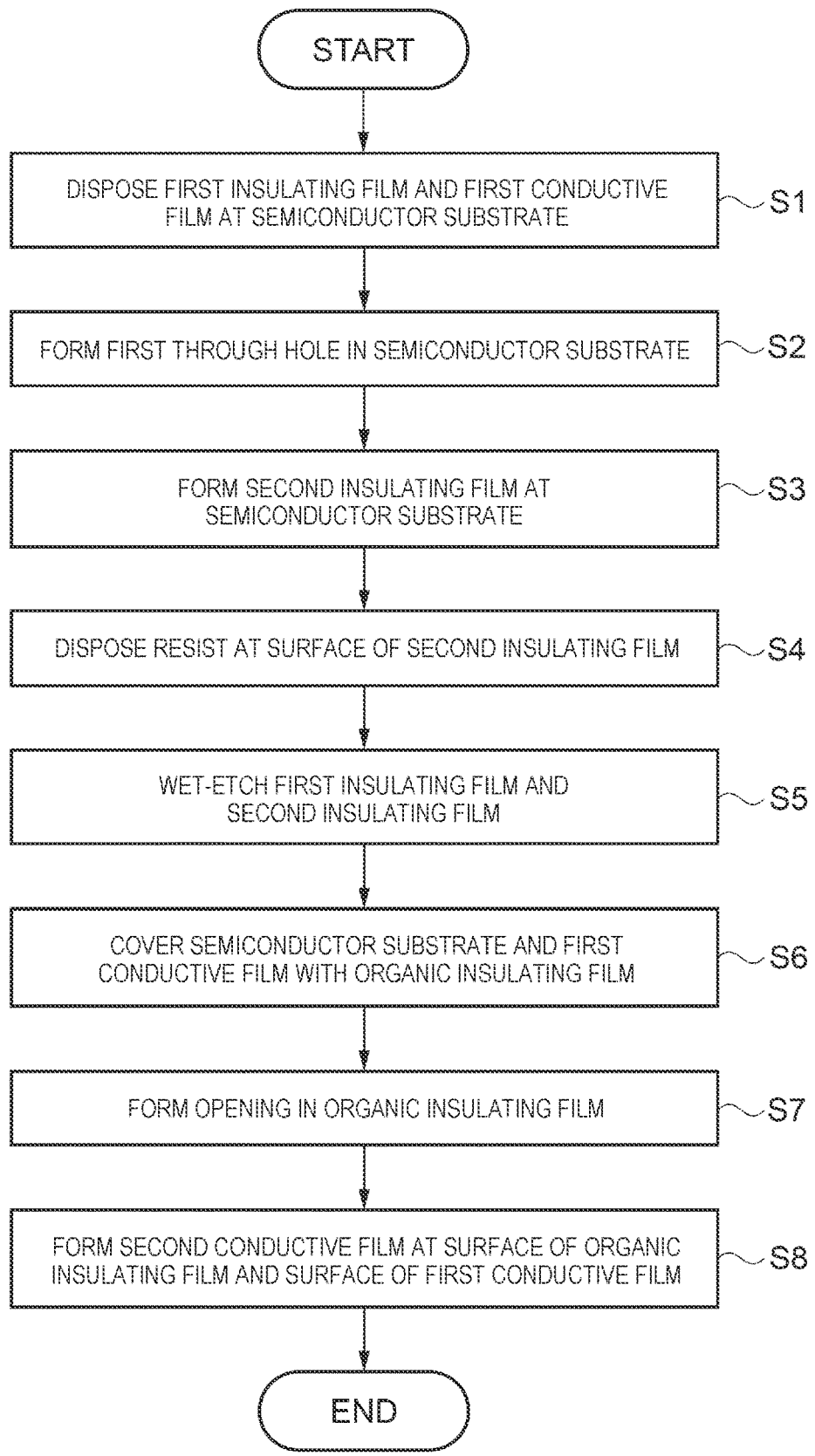
FIG. 2 is a flowchart showing an example of a method for manufacturing the semiconductor device according to the first embodiment.

As shown in FIG. 2, the method for manufacturing the semiconductor device 1 includes step S1 of disposing the first insulating film 4 and the first conductive film 6 at the semiconductor substrate 2, step S2 of forming the first through hole 21 in the semiconductor substrate 2, step S3 of forming the second insulating film 8 at the semiconductor substrate 2, step S4 of disposing a resist 53 at a surface of the second insulating film 8, step S5 of wet-etching the first insulating film 4 and the second insulating film 8, step S6 of covering the semiconductor substrate 2 and the first conductive film 6 with the organic insulating film 10, step S7 of forming the opening 101 in the organic insulating film 10, and step S8 of forming the second conductive film 12 at the surface 111 of the organic insulating film 10 and the surface of the first conductive film 6.

Step S1 is a step of disposing the first insulating film 4 and the first conductive film 6 at the semiconductor substrate 2. Specifically, step S1 is a step of disposing the first insulating film 4 and the first conductive film 6 in this order at the lower surface 2B of the semiconductor substrate 2 having the upper surface 2A and the lower surface 2B.

Figure 3:
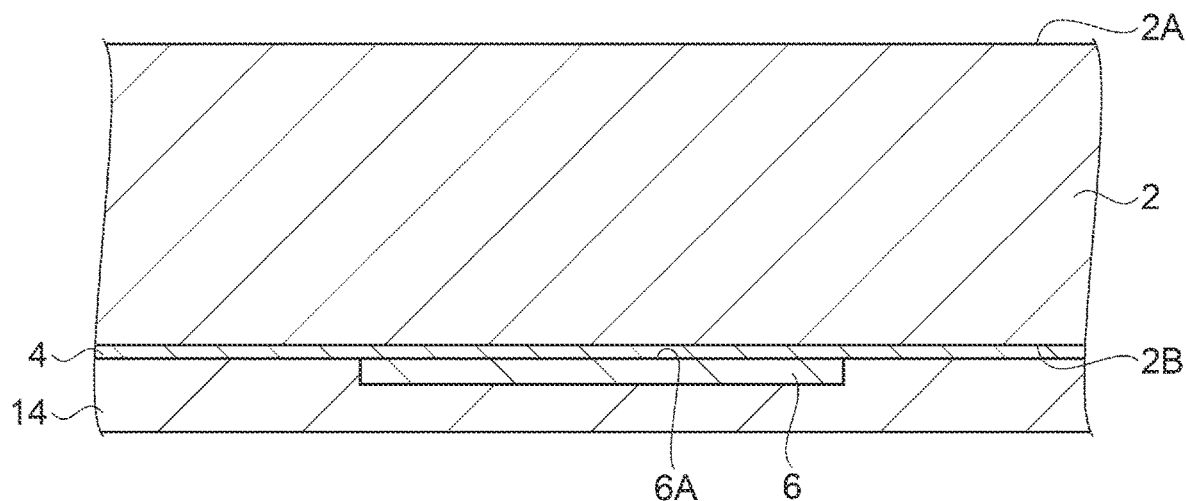
FIG. 3 is a cross-sectional view showing the method for manufacturing the semiconductor device.

As shown in FIG. 3, in step S1, the first insulating film 4 and the first conductive film 6 are disposed in this order at the lower surface 2B of the semiconductor substrate 2. Specifically, the circuit (not shown) is provided at the lower surface 2B of the semiconductor substrate 2, and the first insulating film 4 is disposed at the lower surface 2B to cover the circuit. The first conductive film 6 is disposed at the lower surface 2B of the semiconductor substrate 2 via the first insulating film 4.

Further, in the present embodiment, the third insulating film 14 is disposed at the lower surface of the first insulating film 4 via the first conductive film 6.

As described above, in the present embodiment, the semiconductor substrate 2 is made of silicon, the first insulating film 4 and the third insulating film 14 are made of silicon oxide, and the first conductive film 6 is made of aluminum.

Step S2 is a step of forming the first through hole 21 in the semiconductor substrate 2. Specifically, step S2 is a step of forming the first through hole 21 penetrating from the upper surface 2A to the lower surface 2B of the semiconductor substrate 2 and exposing the first insulating film 4 disposed at the lower surface 2B from the first through hole 21.

Figure 4:
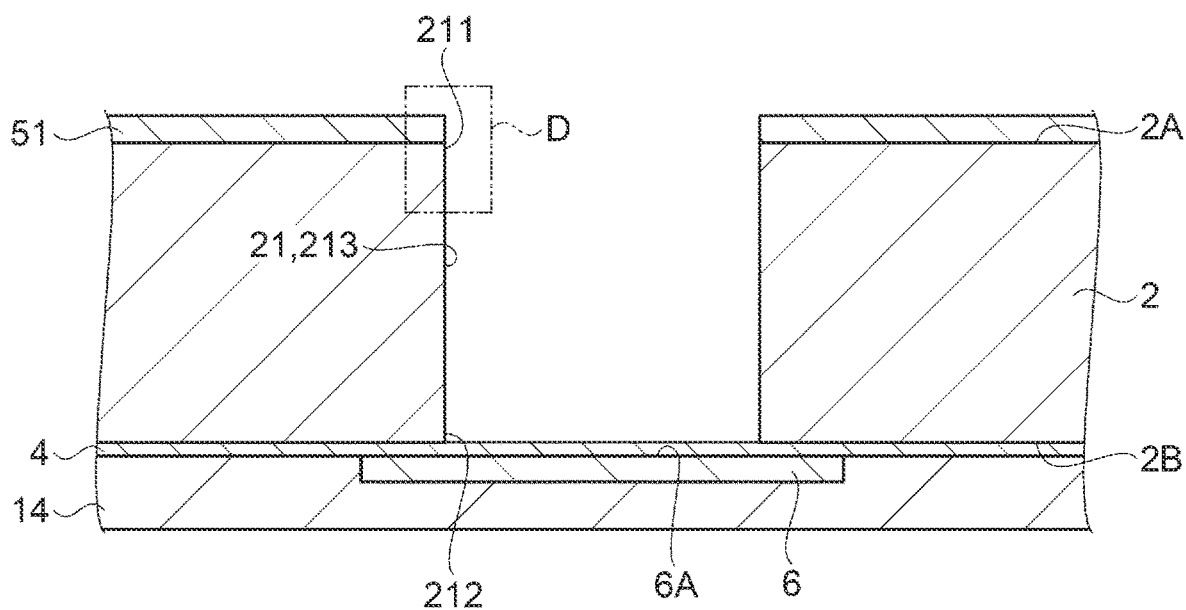
FIG. 4 is a cross-sectional view showing the method for manufacturing the semiconductor device.

As shown in FIG. 4, in step S2, the first through hole 21 penetrating from the upper surface 2A to the lower surface 2B of the semiconductor substrate 2 is formed in the semiconductor substrate 2. The first through hole 21 is formed in the semiconductor substrate 2 by using a known photolithography technique and an etching technique.

In the present embodiment, first, a silicon oxide film 51 having an opening corresponding to the first through hole 21 is formed at the upper surface 2A of the semiconductor substrate 2. The semiconductor substrate 2 is etched with the silicon oxide film 51 as a mask to form the first through hole 21. The mask for forming the first through hole 21 is not limited to the silicon oxide film 51. The mask for forming the first through hole 21 may be, for example, a resist having an opening corresponding to the first through hole 21.

In the present embodiment, the first through hole 21 is formed by dry-etching the semiconductor substrate 2. Specifically, the first through hole 21 is formed by using a Bosch method.

In the Bosch method, an etching step of performing etching with an etching gas and a deposition step of forming a protective film at the side surface 213 of the first through hole 21 are alternately performed. Accordingly, the Bosch method can perform etching having a high aspect ratio.

Figure 5:
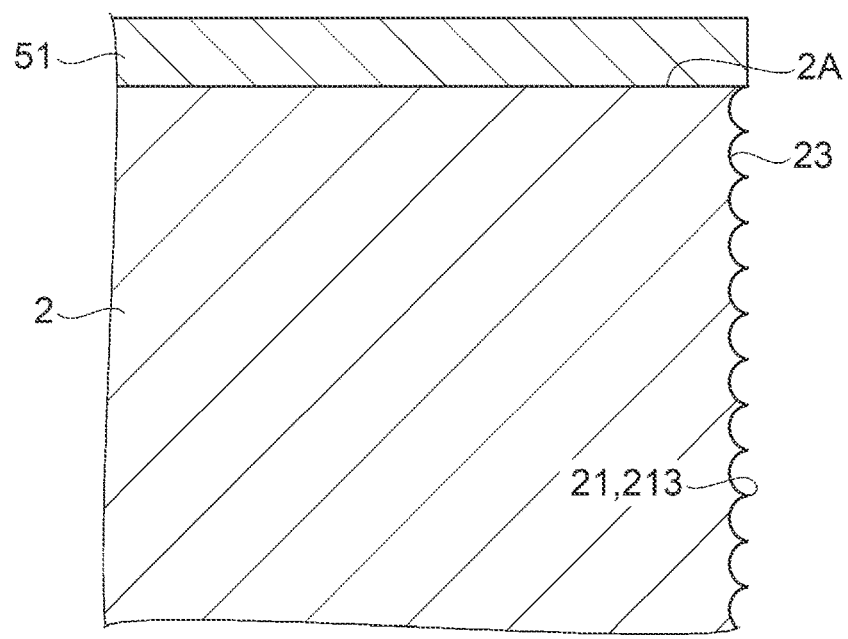
FIG. 5 is an enlarged cross-sectional view of a portion D in FIG. 4.

As shown in FIG. 5, scallops 23 corresponding to the number of times of performing the etching step are formed, due to isotropic etching of the etching step, in the side surface 213 of the first through hole 21 formed by using the Bosch method. The scallops 23 are recesses recessed toward an outside of the first through hole 21 along a plane intersecting the thickness direction of the semiconductor substrate 2.

Accordingly, a surface shape of the side surface 213 of the first through hole 21 is an uneven shape in which a plurality of the scallops 23 are continuously formed.

By forming the first through hole 21 penetrating from the upper surface 2A to the lower surface 2B of the semiconductor substrate 2, the first insulating film 4 disposed at the lower surface 2B of the semiconductor substrate 2 is exposed from the first through hole 21.

In FIGS. 4 and 5, for convenience of description, the silicon oxide film 51 as the mask for forming the first through hole 21 is shown. In step S2, the silicon oxide film 51 is removed after the first through hole 21 is formed.

Step S3 is a step of forming the second insulating film 8 at the semiconductor substrate 2. Specifically, step S3 is a step of forming the second insulating film 8 at the upper surface 2A of the semiconductor substrate 2 and the side surface 213 of the first through hole 21.

Figure 6:
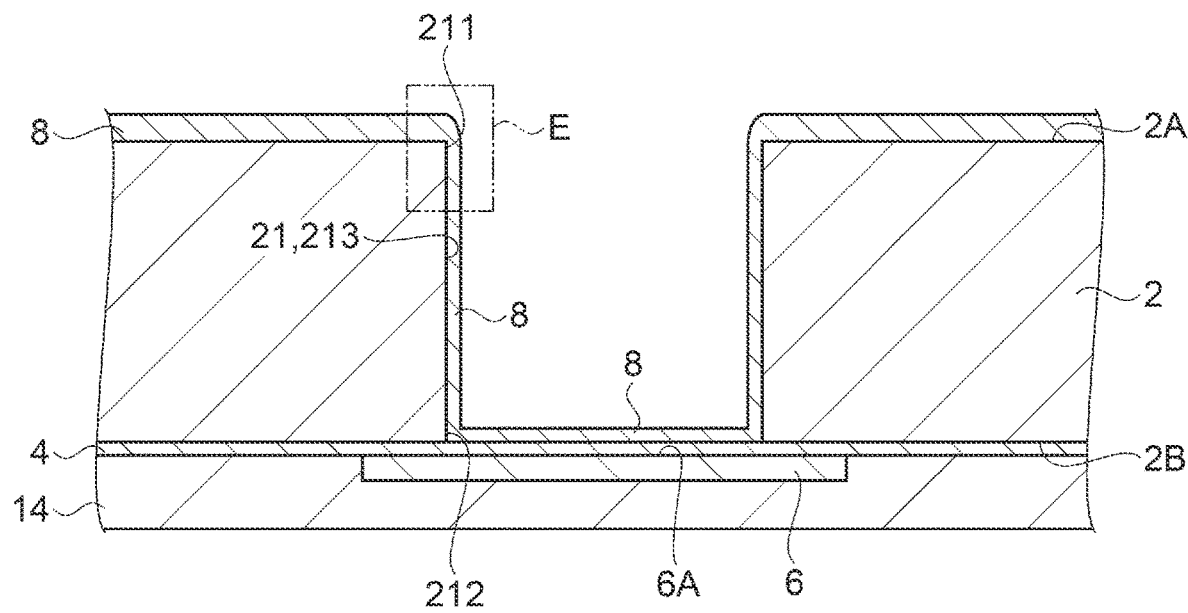
FIG. 6 is a cross-sectional view showing the method for manufacturing the semiconductor device.

As shown in FIG. 6, in step S3, the second insulating film 8 is formed at the upper surface 2A of the semiconductor substrate 2 and the side surface 213 of the first through hole 21. In step S3, the second insulating film 8 is also formed at the upper surface of the first insulating film 4 exposed from the first through hole 21 via the second opening 212 of the first through hole 21.

In the present embodiment, the second insulating film 8 is formed by using a chemical vapor deposition (CVD) method. A method for forming the second insulating film 8 is not limited to the CVD method. For example, the second insulating film 8 may be formed by using a sputtering method.

As described above, in the present embodiment, the second insulating film 8 is made of silicon oxide.

Figure 7:
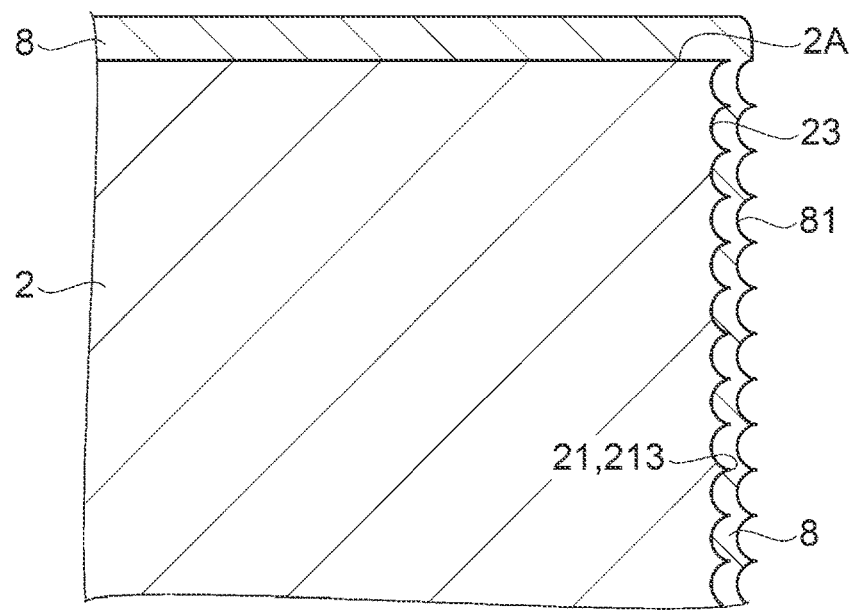
FIG. 7 is an enlarged cross-sectional view of a portion E in FIG. 6.

As shown in FIG. 7, the second insulating film 8 formed at the side surface 213 of the first through hole 21 is formed along the surface shape of the side surface 213. Accordingly, recesses 81 corresponding to the scallops 23 formed in the side surface 213 are formed in the second insulating film 8, and a surface shape of the second insulating film 8 is an uneven shape in which a plurality of the recesses 81 respectively corresponding to the plurality of scallops 23 are continuously formed.

Step S4 is a step of disposing the resist 53 at the surface of the second insulating film 8. Specifically, step S4 is a step of disposing the resist 53 at the surface of the second insulating film 8 from the upper surface 2A of the semiconductor substrate 2 to an end portion of the semiconductor substrate 2 on the upper surface 2A side in the side surface 213 of the first through hole 21. The surface of the second insulating film 8 is a surface on a side opposite to a surface facing the upper surface 2A of the semiconductor substrate 2 and the side surface 213 of the first through hole 21.

In step S4, first, the resist 53 is applied to the surface of the second insulating film 8, and then the resist 53 applied to the surface of the second insulating film 8 is patterned.

Figure 8:
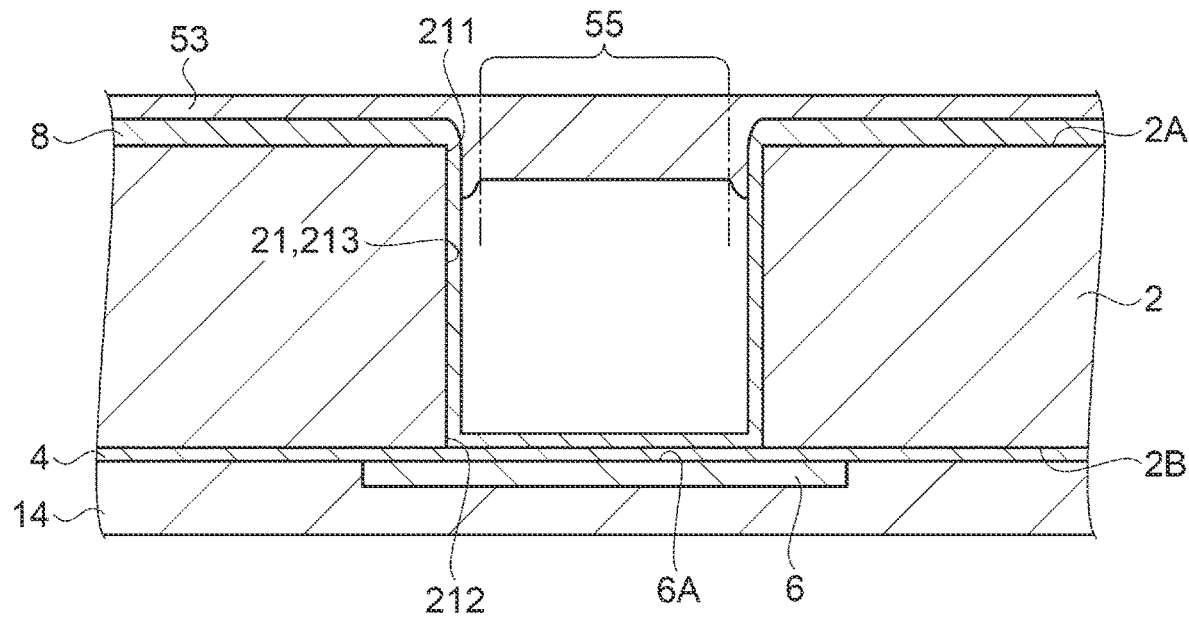
FIG. 8 is a cross-sectional view showing the method for manufacturing the semiconductor device.

As shown in FIG. 8, the resist 53 is applied to the surface of the second insulating film 8. Specifically, the resist 53 is applied to the surface of the second insulating film 8 formed at the upper surface 2A of the semiconductor substrate 2 and the surface of the second insulating film 8 disposed at the end portion of the side surface 213 of the first through hole 21 located on the upper surface 2A side of the semiconductor substrate 2. The first opening 211 of the first through hole 21 is closed by the resist 53. In the present embodiment, the resist 53 is applied to the second insulating film 8 by a spin coating method.

Next, the resist 53 applied to the second insulating film 8 is patterned. The patterning of the resist 53 is performed by using the known photolithography technique. Specifically, a region 55 located in a central portion of the first through hole 21 when viewed in the thickness direction of the semiconductor substrate 2 is removed from the resist 53 formed to close the first opening 211 of the first through hole 21. Accordingly, the resist 53 becomes as shown in FIG. 9.

Figure 9:
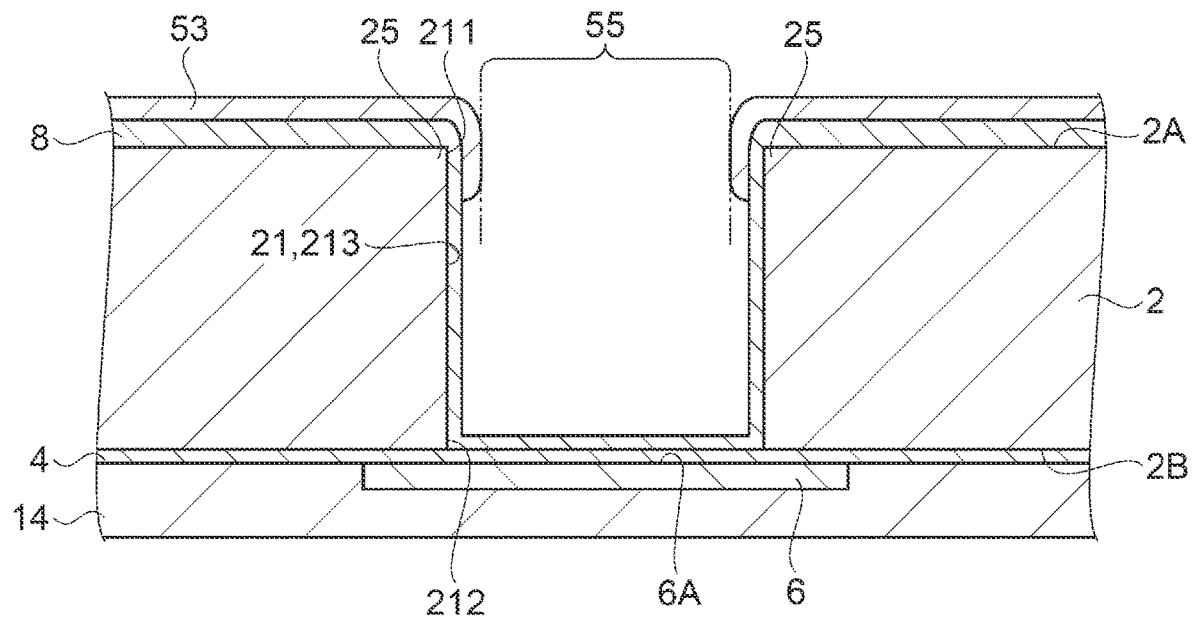
FIG. 9 is a cross-sectional view showing the method for manufacturing the semiconductor device.

As shown in FIG. 9, the resist 53 is disposed at the surface of the second insulating film 8 formed at the upper surface 2A of the semiconductor substrate 2 and the surface of the second insulating film 8 disposed at the end portion of the semiconductor substrate 2 on the upper surface 2A side in the second insulating film 8 formed at the side surface 213 of the first through hole 21. That is, the resist 53 is disposed at the surface of the second insulating film 8 from the upper surface 2A of the semiconductor substrate 2 to the end portion of the semiconductor substrate 2 on the upper surface 2A side in the side surface 213 of the first through hole 21. In other words, the resist 53 is disposed to cover the shoulder portion 25 of the first through hole 21.

Step S5 is a step of wet-etching the first insulating film 4 and the second insulating film 8. Specifically, the first insulating film 4 and the second insulating film 8 are wet-etched by using the resist 53 as the mask to form the second through hole 41 continuous with the first through hole 21 in the first insulating film 4.

Figure 10:
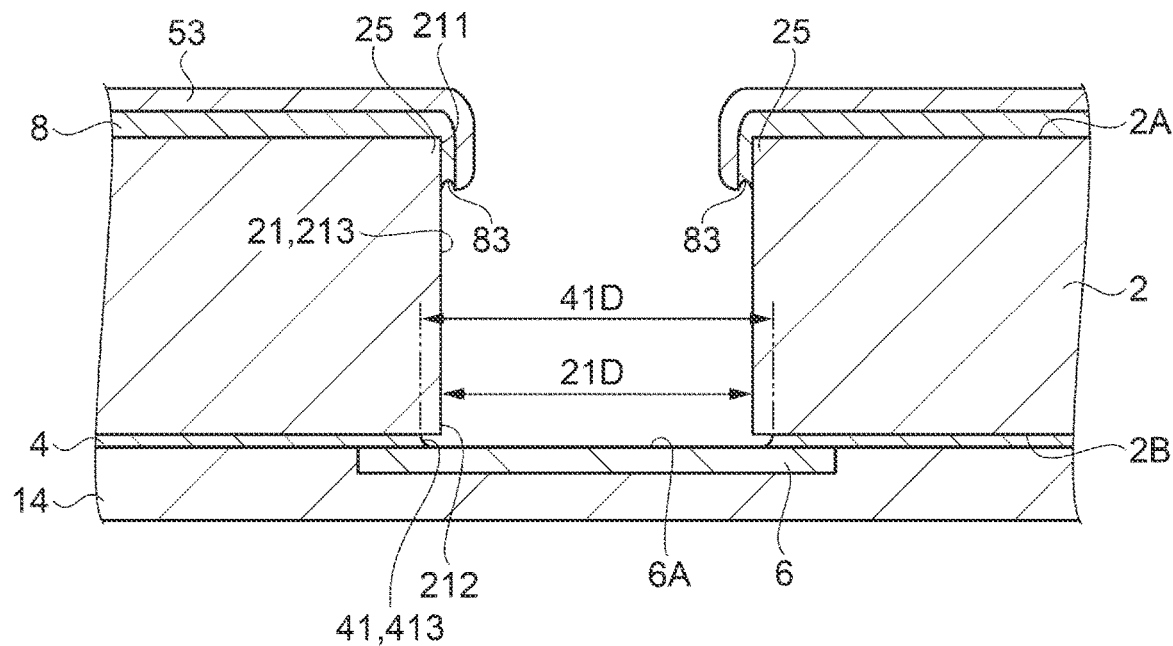
FIG. 10 is a cross-sectional view showing the method for manufacturing the semiconductor device.

As shown in FIG. 10, in step S5, first, the second insulating film 8 is wet-etched by using the resist 53 as the mask. Accordingly, inside the first through hole 21, the second insulating film 8 disposed at a position other than the end portion of the semiconductor substrate 2 on the upper surface 2A side is removed. Here, inside the first through hole 21, the second insulating film 8 disposed at a position other than the end portion of the semiconductor substrate 2 on the upper surface 2A side refers to the second insulating film 8 disposed on the lower surface 2B side of the semiconductor substrate 2 in the second insulating film 8 formed at the side surface 213 of the first through hole 21 and the second insulating film 8 formed at the upper surface of the first insulating film 4 via the second opening 212 of the first through hole 21. By removing the second insulating film 8 formed at the upper surface of the first insulating film 4, the first insulating film 4 is exposed from the first through hole 21. In the present embodiment, the first insulating film 4 and the second insulating film 8 are made of silicon oxide. Therefore, in step S5, the first insulating film 4 exposed from the first through hole 21 is also etched together with the second insulating film 8 formed at the upper surface of the first insulating film 4. In this way, in step S5, the first insulating film 4 and the second insulating film 8 are collectively etched, and the second through hole 41 continuous with the first through hole 21 is formed in the first insulating film 4. By forming the second through hole 41, the upper surface 6A of the first conductive film 6 is exposed to the first through hole 21 through the second through hole 41.

Further, in step S5, the second insulating film 8 disposed on the lower surface 2B side of the semiconductor substrate 2 in the second insulating film 8 formed at the side surface 213 of the first through hole 21 is removed, and the second insulating film 8 disposed at the end portion of the semiconductor substrate 2 on the upper surface 2A side is not removed. Accordingly, the second insulating film 8 is disposed from the upper surface 2A of the semiconductor substrate 2 to the end portion of the semiconductor substrate 2 on the upper surface 2A side in the side surface 213 of the first through hole 21.

Here, for example, when the second insulating film 8 disposed on the lower surface 2B side of the semiconductor substrate 2 in the second insulating film 8 formed at the side surface 213 of the first through hole 21 is not removed, a yield of the semiconductor device 1 may decrease as in the related art.

A reason thereof is that the second insulating film 8 disposed on the lower surface 2B side of the semiconductor substrate 2 at the side surface 213 of the first through hole 21 is likely to fall off from the side surface 213 during a manufacturing process of the semiconductor device 1. Then, when the second insulating film 8 fell from the side surface 213 adheres to the upper surface 6A of the first conductive film 6 exposed to the first through hole 21, electrical coupling between the first conductive film 6 and the second conductive film 12 to be formed in step S8, which will be described later, becomes unstable, and the yield of the semiconductor device 1 decreases.

However, in the present embodiment, as described above, the second insulating film 8 disposed on the lower surface 2B side of the semiconductor substrate 2 in the second insulating film 8 formed at the side surface 213 of the first through hole 21 is removed. Therefore, the falling-off of the second insulating film 8 from the side surface 213 of the first through hole 21 is reduced. Therefore, the electrical coupling between the first conductive film 6 and the second conductive film 12 is stabilized, and the yield of the semiconductor device 1 is improved.

In the present embodiment, the first insulating film 4 and the second insulating film 8 are etched by the wet-etching. Compared to the dry-etching in which single wafer processing is performed on the semiconductor substrate 2, the semiconductor device 1 can be efficiently manufactured by using wet-etching in which a plurality of semiconductor substrates 2 can be collectively processed in a batch.

In the present embodiment, the first insulating film 4 is over-etched at the side surface 413 thereof in a direction along the lower surface 2B of the semiconductor substrate 2. Accordingly, an opening width 41D of the second through hole 41 formed in the first insulating film 4 is larger than an opening width 21D of the first through hole 21 on the lower surface 2B side.

Further, in the present embodiment, the second insulating film 8 disposed at the end portion of the semiconductor substrate 2 on the upper surface 2A side in the side surface 213 of the first through hole 21 is over-etched, at an end surface 83 of the second insulating film 8, in a direction toward the upper surface 2A along the side surface 213.

In this way, in step S5, the first insulating film 4 and the second insulating film 8 are over-etched. By setting etching conditions of the wet-etching such that the first insulating film 4 and the second insulating film 8 are over-etched, the second insulating film 8 disposed on the lower surface 2B side of the semiconductor substrate 2 in the side surface 213 of the first through hole 21 can be reliably removed. Accordingly, the yield of the semiconductor device 1 is further improved.

For the convenience of description, FIG. 10 shows the resist 53. However, in step S5, the resist 53 is removed after the first insulating film 4 and the second insulating film 8 are etched.

Step S6 is a step of covering the semiconductor substrate 2 and the first conductive film 6 with the organic insulating film 10. Specifically, step S6 is a step of covering the upper surface 2A of the semiconductor substrate 2, the side surface 213 of the first through hole 21, the side surface 413 of the second through hole 41, and the upper surface 6A of the first conductive film 6 exposed from the second through hole 41 with the organic insulating film 10.

Figure 11:
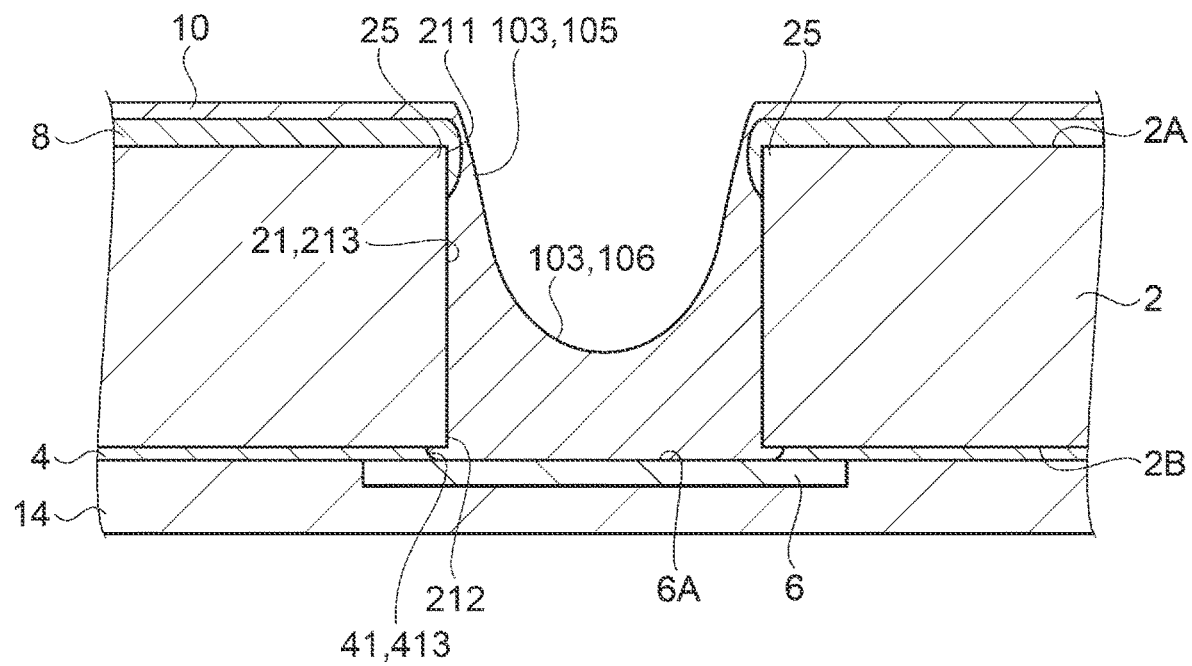
FIG. 11 is a cross-sectional view showing the method for manufacturing the semiconductor device.

As shown in FIG. 11, the upper surface 2A of the semiconductor substrate 2, the side surface 213 of the first through hole 21, the side surface 413 of the second through hole 41, and the upper surface 6A of the first conductive film 6 exposed from the second through hole 41 are covered with the organic insulating film 10. Specifically, the upper surface 2A of the semiconductor substrate 2 and the end portion of the semiconductor substrate 2 on the upper surface 2A side in the side surface 213 of the first through hole 21 are covered with the organic insulating film 10 via the second insulating film 8.

In step S6, the organic insulating film 10 is formed by applying a paint containing a resin material for forming the organic insulating film 10 to a surface to be coated. The surface to be coated includes the upper surface 2A of the semiconductor substrate 2, the side surface 213 of the first through hole 21, the side surface 413 of the second through hole 41, and the upper surface 6A of the first conductive film 6 exposed from the second through hole 41. Specifically, in step S6, first, pre-wet processing is performed on the surface to be coated, and then the paint containing the resin material for forming the organic insulating film 10 is applied to the surface to be coated.

The pre-wet processing is processing of wetting the surface to be coated with a solvent or the like of the paint containing the resin material for forming the organic insulating film 10 before the paint is applied. Wettability of the surface to be coated with respect to the paint containing the resin material forming the organic insulating film 10 is improved by the pre-wet processing. In the present embodiment, the pre-wet processing is performed by first irradiating the surface to be coated with an ultraviolet ray to activate the surface to be coated, and then applying propylene glycol monomethyl ether acetate as the solvent to the surface to be coated.

When the pre-wet processing ends, the paint containing the resin material for forming the organic insulating film 10 is applied to the surface to be coated. In the present embodiment, the paint containing the resin material for forming the organic insulating film 10 is applied to the upper surface 2A of the semiconductor substrate 2, the side surface 213 of the first through hole 21, the side surface 413 of the second through hole 41, and the upper surface 6A of the first conductive film 6 exposed from the second through hole 41 by the spin coating method.

In the present embodiment, the resin material forming the organic insulating film 10 is a positive photosensitive resin. The resin material forming the organic insulating film 10 is not limited to the positive photosensitive resin. For example, a negative photosensitive resin may be used.

As described above, in the present embodiment, the organic insulating film 10 is made of an epoxy resin.

Further, as shown in FIG. 11, in step S6, the organic insulating film 10 is formed to completely fill the second through hole 41 and fill the lower surface 2B side of the semiconductor substrate 2 in the first through hole 21 located above the second through hole 41. The organic insulating film 10 forms a recess 103 recessed toward the lower surface 2B side of the semiconductor substrate 2 inside the first through hole 21. The recess 103 has a side surface 105 and a bottom surface 106. The side surface 105 has a tapered shape that gradually narrows toward the lower surface 2B side of the semiconductor substrate 2. The bottom surface 106 has a meniscus shape recessed toward the lower surface 2B side of the semiconductor substrate 2.

Step S7 is a step of forming the opening 101 for exposing the first conductive film 6 in the organic insulating film 10.

Figure 12:
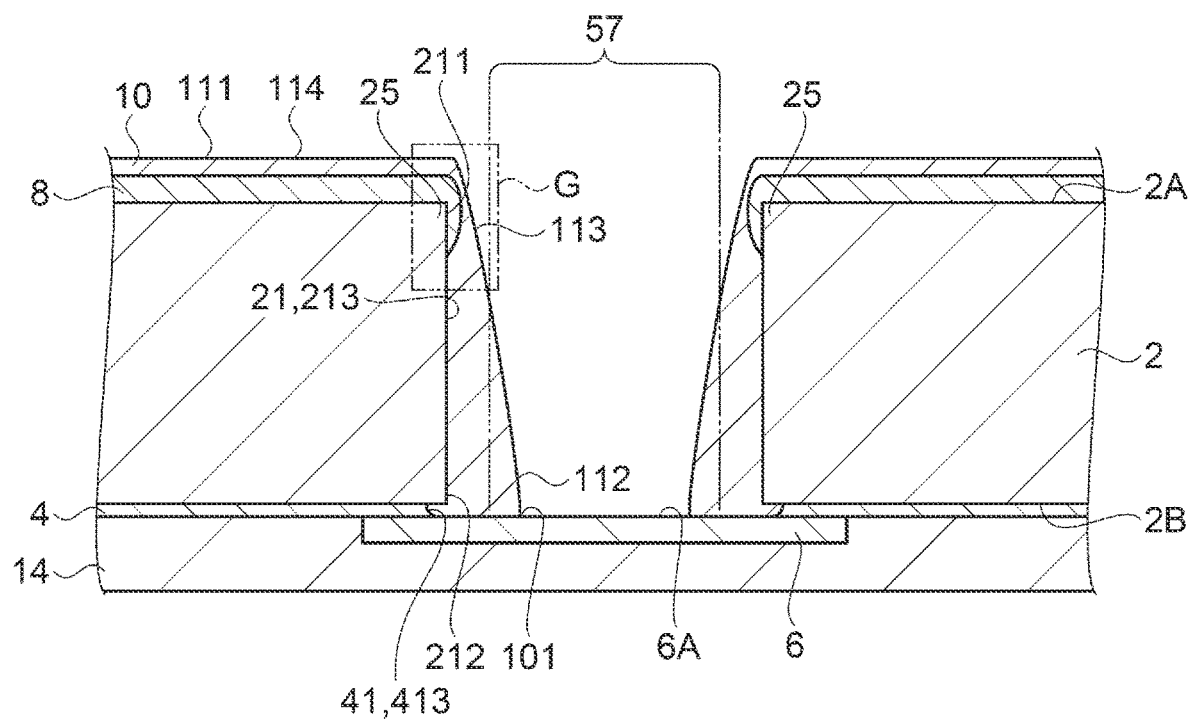
FIG. 12 is a cross-sectional view showing the method for manufacturing the semiconductor device.

As shown in FIG. 12, by forming the opening 101 in the organic insulating film 10, the upper surface 6A of the first conductive film 6 is exposed from the opening 101.

In the present embodiment, as described above, the organic insulating film 10 is made of the positive photosensitive resin. Therefore, first, a portion of the organic insulating film 10 corresponding to the opening 101 is exposed from the upper surface 2A side of the semiconductor substrate 2 by using a mask (not shown). Next, the organic insulating film 10 after the exposure is developed. Accordingly, the portion of the organic insulating film 10 corresponding to the opening 101 is removed, and the opening 101 is formed in the organic insulating film 10.

In addition, by exposing and developing the organic insulating film 10 made of the positive photosensitive resin from the upper surface 2A side of the semiconductor substrate 2, the surface 111 of the organic insulating film 10 inside the first through hole 21, that is, the first surface 112 and the second surface 113 of the organic insulating film 10 are formed in a tapered shape that gradually narrows from the upper surface 2A to the lower surface 2B of the semiconductor substrate 2.

In the present embodiment, an exposure region 57 generated when the portion corresponding to the opening 101 is exposed by using a mask (not shown) is located inside an outer edge of the second opening 212 of the first through hole 21. Therefore, the organic insulating film 10 located between an outer edge of the exposure region 57 and the outer edge of the second opening 212 of the first through hole 21 is not exposed. In other words, the organic insulating film 10 located between the outer edge of the exposure region 57 and the outer edge of the second opening 212 of the first through hole 21 is not removed in step S7. The surface 111 of the organic insulating film 10 located between the outer edge of the exposure region 57 and the outer edge of the second opening 212 of the first through hole 21 corresponds to the side surface 105 of the recess 103 mainly shown in FIG. 11. Therefore, the surface 111 of the organic insulating film 10 located between the outer edge of the exposure region 57 and the outer edge of the second opening 212 of the first through hole 21 is formed in a tapered shape that gradually narrows toward the lower surface 2B side of the semiconductor substrate 2.

In the exposure region 57, a light emitted from the upper surface 2A side of the semiconductor substrate 2 to the organic insulating film 10 is attenuated toward the lower surface 2B side of the semiconductor substrate 2. Further, the light emitted from the upper surface 2A side of the semiconductor substrate 2 to the organic insulating film 10 is diffracted by the meniscus shape of the bottom surface 106 of the recess 103 shown in FIG. 11. Since such attenuation and diffraction of the light occur in the exposure region 57, when the organic insulating film 10 after the exposure is developed, the surface 111 of the organic insulating film 10 in the exposure region 57 is easily formed in a tapered shape that gradually narrows toward the lower surface 2B side of the semiconductor substrate 2.

In the organic insulating film 10 after the development, the surface 111 of the organic insulating film 10 located between the outer edge of the exposure region 57 and the outer edge of the second opening 212 of the first through hole 21 is continuously coupled to the surface 111 of the organic insulating film 10 in the exposure region 57.

In this way, the surface 111 of the organic insulating film 10 inside the first through hole 21, that is, the first surface 112 and the second surface 113 of the organic insulating film 10 are formed in a tapered shape that gradually narrows from the upper surface 2A to the lower surface 2B of the semiconductor substrate 2.

That is, in step S7, the first surface 112 and the second surface 113 of the organic insulating film 10 are formed together with the opening 101. The first surface 112 and the second surface 113 of the organic insulating film 10 are continuously coupled to each other. Further, the first surface 112 and the second surface 113 of the organic insulating film 10 have a tapered shape that gradually narrows from the upper surface 2A toward the lower surface 2B of the semiconductor substrate 2.

In the present embodiment, the first surface 112 of the organic insulating film 10 is formed in the exposure region 57, and the relay surface (not shown) may be formed in the exposure region 57 together with the first surface 112. As described above, the relay surface is disposed between the first surface 112 and the second surface 113. For example, the relay surface can be formed parallel to the thickness direction of the semiconductor substrate 2 by appropriately adjusting exposure conditions in the exposure region 57 and a shape of the bottom surface 106 of the recess 103 shown in FIG. 11.

Figure 13:
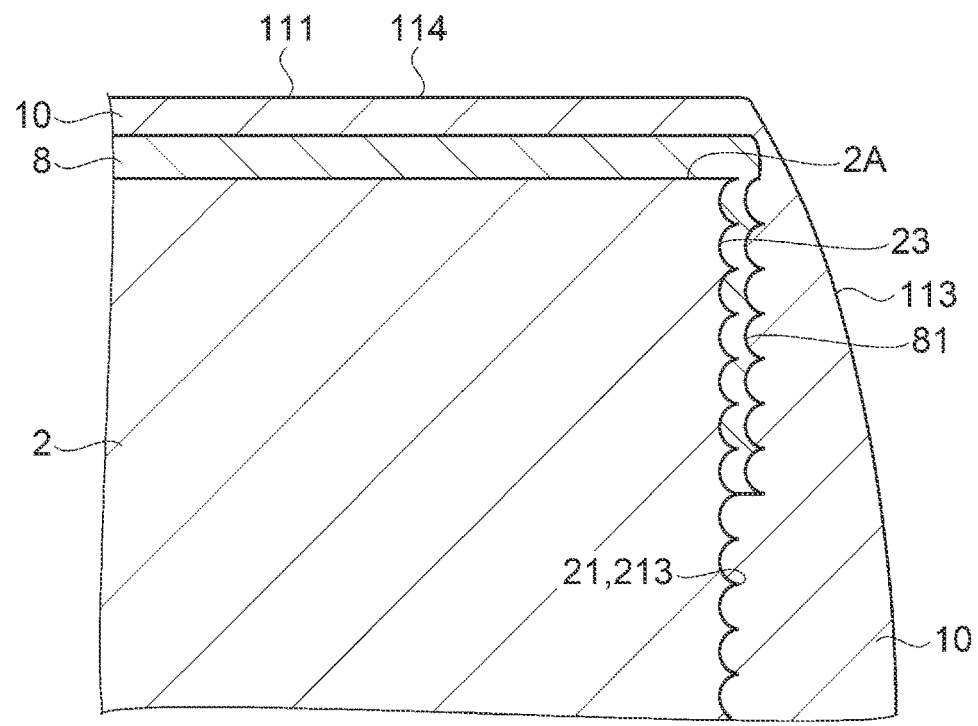
FIG. 13 is an enlarged cross-sectional view of a portion G in FIG. 12.

As shown in FIG. 13, the plurality of scallops 23 are formed in the side surface 213 of the first through hole 21, and the plurality of recesses 81 corresponding to the scallops 23 formed in the side surface 213 are formed in the second insulating film 8 formed at the side surface 213 of the first through hole 21. The scallops 23 and the recesses 81 are filled with the organic insulating film 10 disposed at the side surface 213 of the first through hole 21. Accordingly, the second surface 113 of the organic insulating film 10 disposed at the side surface 213 of the first through hole 21 becomes a smooth surface. Although not shown in FIG. 13, the first surface 112 of the organic insulating film 10 also becomes a smooth surface similarly to the second surface 113. Therefore, in step S8 to be described later, the second conductive film 12 can be stably formed at the first surface 112 and the second surface 113 of the organic insulating film 10.

Step S8 is a step of forming the second conductive film 12 at the surface 111 of the organic insulating film and the upper surface 6A which is the surface of the first conductive film 6. Specifically, step S8 is a step of forming the second conductive film 12 at the first surface 112, the second surface 113, and the third surface 114 of the organic insulating film 10 and the upper surface 6A of the first conductive film 6 exposed from the opening 101 formed in the organic insulating film 10.

In the present embodiment, the second conductive film 12 is formed by using the sputtering method. A method for forming the second conductive film 12 is not limited to the sputtering method. For example, the second conductive film 12 may be formed by using a vapor deposition method.

As described above, in the present embodiment, the second conductive film 12 is a metal film including a barrier layer (not shown) and a metal layer (not shown) stacked on the barrier layer. The barrier layer is made of an alloy of titanium and tungsten. The metal layer is made of copper.

In step S8, the second conductive film 12 is formed at the first surface 112, the second surface 113, and the third surface 114 of the organic insulating film 10 and the upper surface 6A of the first conductive film 6, thereby manufacturing the semiconductor device 1 shown in FIG. 1.

In this way, the semiconductor device 1 is manufactured by the above-described steps S1 to S8.

As described above, when the second insulating film 8 fell off from the side surface 213 of the first through hole 21 adheres to the upper surface 6A of the first conductive film 6, the electrical coupling between the second conductive film 12 formed in step S8 and the first conductive film 6 may become unstable, and the yield of the semiconductor device 1 may decrease. However, in the present embodiment, by reducing the falling-off of the second insulating film 8 from the side surface 213 of the first through hole 21 in step S5, the electrical coupling between the second conductive film 12 formed in step S8 and the first conductive film 6 is stabilized, and the yield of the semiconductor device 1 is improved.

Here, for example, to reduce the falling-off of the second insulating film 8 from the side surface 213 of the first through hole 21, it is considered that the second insulating film 8 is not formed by omitting step S3 or the entire second insulating film 8 disposed at the side surface 213 of the first through hole 21 is removed in step S5. However, when the second insulating film 8 is not formed or when the entire second insulating film 8 disposed at the side surface 213 of the first through hole 21 is removed, an insulating property between the semiconductor substrate 2 and the second conductive film 12 may not be ensured in the shoulder portion 25 shown in FIG. 1.

A reason thereof is that a film thickness of the organic insulating film 10 tends to be reduced in the shoulder portion 25. That is, when the second insulating film 8 is not formed or when the entire second insulating film 8 disposed at the side surface 213 of the first through hole 21 is removed, electrical insulation between the semiconductor substrate 2 and the second conductive film 12 in the shoulder portion 25 is performed only by the organic insulating film 10. However, since the film thickness of the organic insulating film 10 tends to be reduced in the shoulder portion 25, the insulating property between the semiconductor substrate 2 and the second conductive film 12 may not be ensured.

In contrast, in the present embodiment, as described above, the second insulating film 8 is disposed to cover the shoulder portion 25 of the first through hole 21. That is, the shoulder portion 25 is covered with the second insulating film 8 and the organic insulating film 10. Therefore, even when the film thickness of the organic insulating film 10 is reduced in the shoulder portion 25, the insulating property between the semiconductor substrate 2 and the second conductive film 12 can be ensured.

In the present embodiment, as shown in FIG. 12, the surface 111 of the organic insulating film 10 inside the first through hole 21, that is, the first surface 112 and the second surface 113 of the organic insulating film 10 has a tapered shape that gradually narrows from the upper surface 2A toward the lower surface 2B of the semiconductor substrate 2. Therefore, when the second conductive film 12 is formed by the sputtering method, or the like, in step S8, the second conductive film 12 can be stably formed at the first surface 112 and the second surface 113 of the organic insulating film 10.

In the present embodiment, since the first surface 112 coupled to the upper surface 6A of the first conductive film 6 has a tapered shape, the electrical coupling between the second conductive film 12 formed at the first surface 112 and the second conductive film 12 formed at the upper surface 6A of the first conductive film 6 can be reliably performed.

In the present embodiment, since the second surface 113 coupled to the third surface 114 has a tapered shape, the electrical coupling between the second conductive film 12 formed at the third surface 114 and the second conductive film 12 formed at the second surface 113 can be reliably performed.

In the present embodiment, as shown in FIG. 13, the second surface 113 of the organic insulating film 10 is a smooth surface. Similarly to the second surface 113, the first surface 112 is also a smooth surface. Therefore, the second conductive film 12 can be stably formed at the first surface 112 and the second surface 113 of the organic insulating film 10 in step S8.

As described above, according to the present embodiment, the following effects can be obtained.

The method for manufacturing the semiconductor device 1 includes: disposing the first insulating film 4 and the first conductive film 6 in this order at the lower surface 2B of the semiconductor substrate 2 having the upper surface 2A which is the first surface and the lower surface 2B which is the second surface; forming the first through hole 21 penetrating from the upper surface 2A to the lower surface 2B of the semiconductor substrate 2, and exposing the first insulating film 4 disposed at the lower surface 2B from the first through hole 21; forming the second insulating film 8 at the upper surface 2A of the semiconductor substrate 2 and the side surface 213 of the first through hole 21; disposing the resist 53 at the surface of the second insulating film 8 from the upper surface 2A of the semiconductor substrate 2 to the end portion of the side surface 213 of the first through hole 21 on the upper surface 2A side of the semiconductor substrate 2; wet-etching the first insulating film 4 and the second insulating film 8 by using the resist 53 as the mask to form the second through hole 41 continuous with the first through hole 21 in the first insulating film 4; covering the upper surface 2A of the semiconductor substrate 2, the side surface 213 of the first through hole 21, the side surface 413 of the second through hole 41, and the upper surface 6A which is the surface of the first conductive film 6 exposed from the second through hole 41 with the organic insulating film 10; forming the opening 101 for exposing the first conductive film 6 in the organic insulating film 10; and forming the second conductive film 12 at the surface 111 of the organic insulating film 10 and the upper surface 6A of the first conductive film 6 exposed from the opening 101 formed in the organic insulating film 10.

Accordingly, the falling-off of the second insulating film 8 from the side surface 213 of the first through hole 21 in a middle of the manufacturing process of the semiconductor device 1 can be reduced. Therefore, the electrical coupling between the first conductive film 6 and the second conductive film 12 is stabilized, and the yield of the semiconductor device 1 is improved.

2. Second Embodiment

Next, a method for manufacturing a semiconductor device 1a according to a second embodiment will be described with reference to FIG. 14. The method for manufacturing the semiconductor device 1a is the same as that according to the first embodiment except that a fourth surface 115 as a relay surface is formed between the first surface 112 and the second surface 113 together with the first surface 112 of the organic insulating film 10 in step S7 of the first embodiment.

The same components as those in the first embodiment are denoted by the same reference numerals, and the description thereof is omitted.

Figure 14:
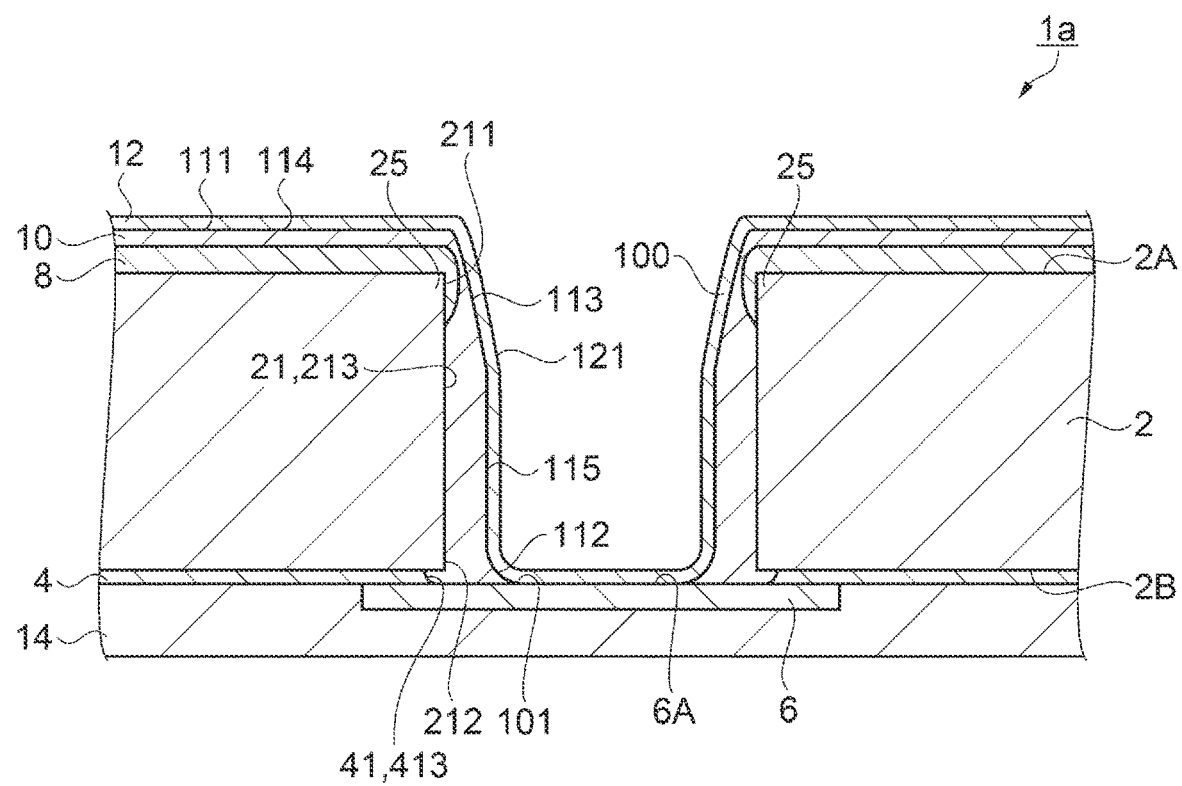
FIG. 14 is a cross-sectional view of a semiconductor device according to a second embodiment.

As shown in FIG. 14, the semiconductor device 1a includes the organic insulating film 10. The surface 111 of the organic insulating film 10 has the first surface 112, the second surface 113, the third surface 114, and the fourth surface 115.

The fourth surface 115 is disposed between the first surface 112 and the second surface 113. The first surface 112 and the second surface 113 are coupled via the fourth surface 115.

In the present embodiment, the fourth surface 115 is formed parallel to the thickness direction of the semiconductor substrate 2 when a manufacturing variation is ignored. In the present embodiment, the fourth surface 115 is formed parallel to the thickness direction of the semiconductor substrate 2, but the fourth surface 115 may not be parallel to the thickness direction of the semiconductor substrate 2. For example, the fourth surface 115 may have a tapered shape. In addition, for example, as long as the second conductive film 12 is formed at the first surface 112 and the fourth surface 115 of the organic insulating film 10 in step S8, the fourth surface 115 may have a reverse tapered shape that gradually expands from the upper surface 2A toward the lower surface 2B of the semiconductor substrate 2.

The method for manufacturing the semiconductor device 1a includes steps S1 to S8 shown in FIG. 2.

Specifically, in the method for manufacturing the semiconductor device 1a, in step S7, the fourth surface 115 as the relay surface is formed between the first surface 112 and the second surface 113 together with the first surface 112 of the organic insulating film 10.

To form the fourth surface 115 in a desired shape in step S7, for example, a shape of the bottom surface 106 of the recess 103 shown in FIG. 11 may be adjusted in step S6, or exposure conditions of the exposure region 57 shown in FIG. 12 may be adjusted in step S7. The exposure conditions of the exposure region 57 can be adjusted by using, for example, a gradation mask. The gradation mask is a mask having a two-dimensional distribution of light transmittance.

As described above, according to the present embodiment, effects similar to those of the first embodiment can be obtained.

3. Third Embodiment

Next, a method for manufacturing a semiconductor device 1b according to a third embodiment will be described with reference to FIG. 15. The method for manufacturing the semiconductor device 1b is the same as that according to the first embodiment except that the method includes a step of burying a metal material 123 in the recess 121 surrounded by the second conductive film 12. That is, the method for manufacturing the semiconductor device 1b further includes the step of burying the metal material 123 in the recess 121 surrounded by the second conductive film 12 in addition to steps S1 to S8 in the first embodiment.

The same components as those in the first embodiment are denoted by the same reference numerals, and the description thereof is omitted.

Figure 15:
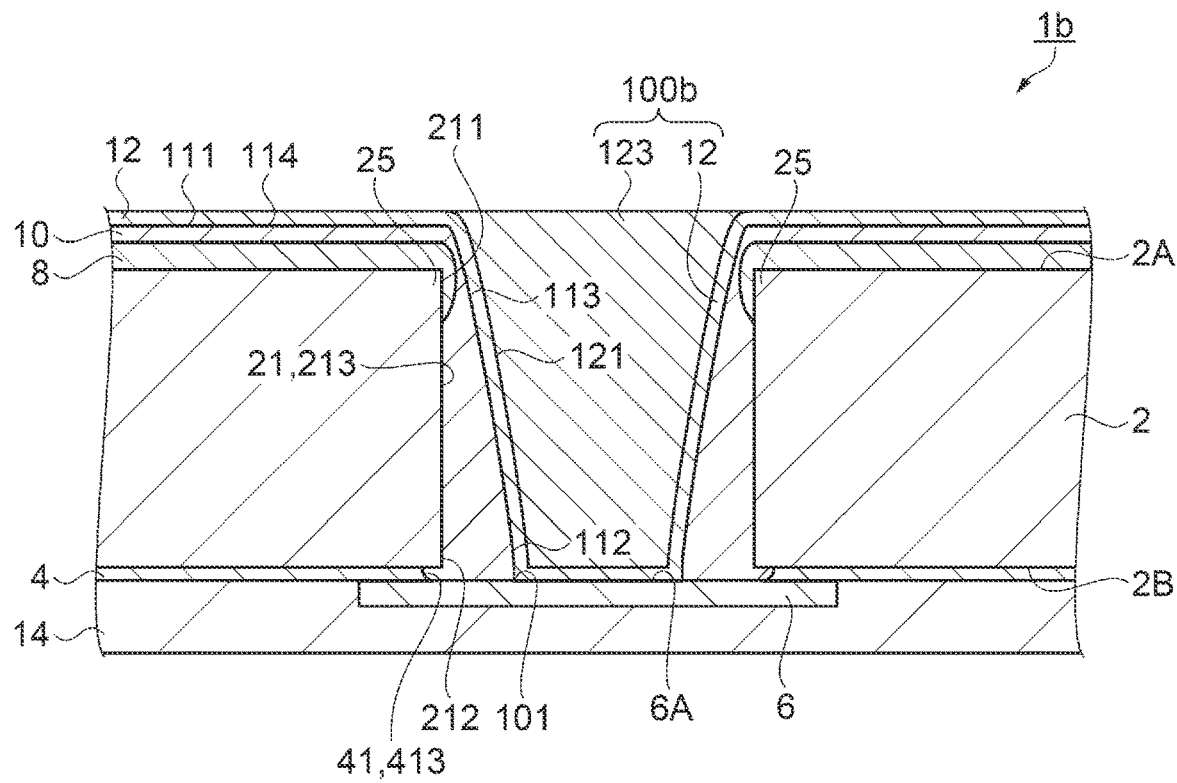
FIG. 15 is a cross-sectional view of a semiconductor device according to a third embodiment.

As shown in FIG. 15, the recess 121 surrounded by the second conductive film 12 is formed in the semiconductor device 1b. The recess 121 is filled with the metal material 123. Accordingly, inside the first through hole 21, the second conductive film 12 and the metal material 123 buried in the recess 121 function as a through electrode 100b.

In the present embodiment, the metal material 123 is copper. The metal material 123 is not limited to copper. The metal material 123 is not particularly limited as long as it is a conductive metal.

The method for manufacturing the semiconductor device 1b further includes the step of burying the metal material 123 in the recess 121 surrounded by the second conductive film 12 in addition to steps S1 to S8 shown in FIG. 2. In the following description, the step of burying the metal material 123 in the recess 121 may be referred to as a "metal burying step".

The metal burying step is performed after step S8.

In the metal burying step, the metal material 123 is buried in the recess 121 surrounded by the second conductive film 12.

In the present embodiment, in the metal burying step, a conductive paste containing the metal material 123 is printed from an upper surface 2A side of the semiconductor substrate 2. Accordingly, the recess 121 is filled with the metal material 123. A method of burying the metal material 123 in the recess 121 is not limited to a printing method of printing the conductive paste. For example, the recess 121 may be filled with the metal material 123 by using a plating method.

In the present embodiment, by burying the metal material 123 in the recess 121, the second conductive film 12 and the metal material 123 buried in the recess 121 function as the through electrode 100b inside the first through hole 21. Electrical coupling of the second conductive film 12 may become unstable when coverage of the second conductive film 12 formed in step S8 is low, but reliability of the through electrode 100b is improved by reinforcing the coverage of the second conductive film 12 with the metal material 123.

As described above, according to the present embodiment, the following effects can be obtained in addition to the effects of the first embodiment.

According to the present embodiment, by burying the metal material 123 in the recess 121 surrounded by the second conductive film 12 inside the first through hole 21, the second conductive film 12 and the metal material 123 buried in the recess 121 can function as the through electrode 100b. Accordingly, reliability of electrical coupling in the through electrode 100b is improved.

4. Fourth Embodiment

Next, a method for manufacturing a semiconductor device 1c according to a fourth embodiment will be described with reference to FIG. 16. The method for manufacturing the semiconductor device 1c is the same as that according to the first embodiment except that the method includes a step of disposing a third conductive film 16 at a surface of the second conductive film 12. That is, the method for manufacturing the semiconductor device 1c further includes the step of disposing the third conductive film 16 at the surface of the second conductive film 12 in addition to steps S1 to S8 in the first embodiment.

The same components as those in the first embodiment are denoted by the same reference numerals, and the description thereof is omitted.

Figure 16:
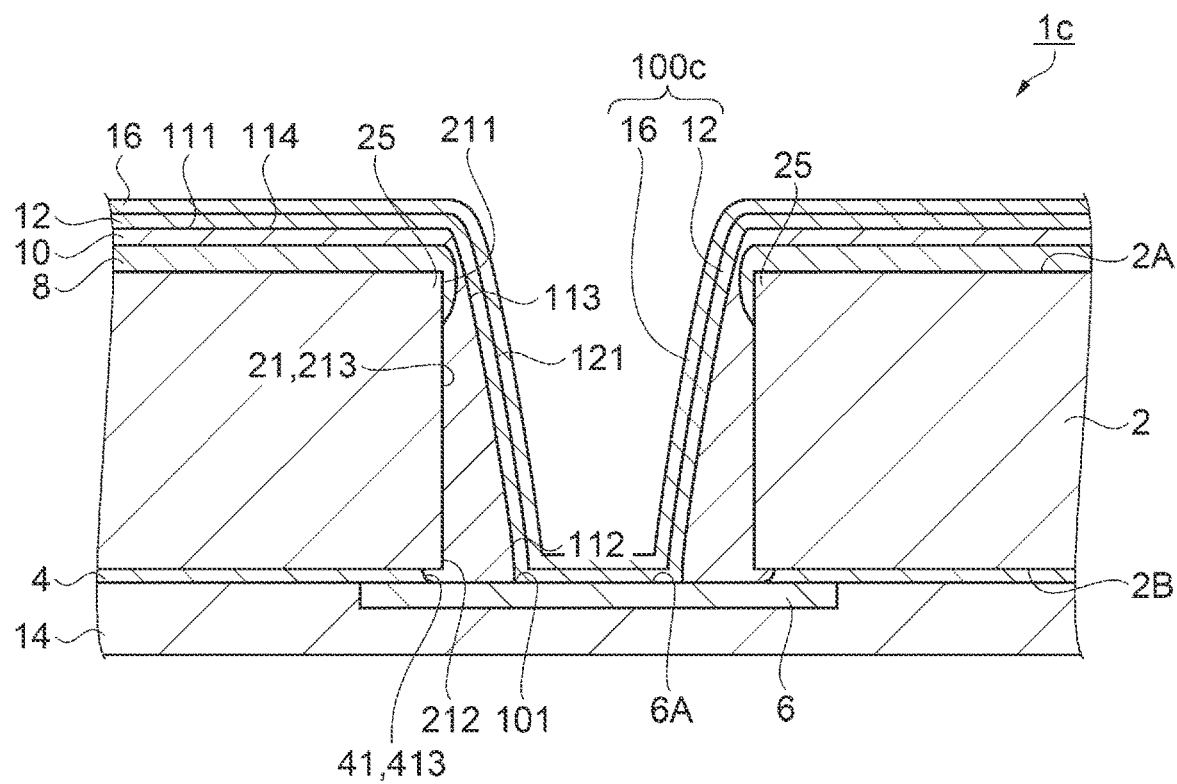
FIG. 16 is a cross-sectional view of a semiconductor device according to a fourth embodiment.

As shown in FIG. 16, the semiconductor device 1c includes the third conductive film 16.

The third conductive film 16 is disposed at the surface of the second conductive film 12. The surface of the second conductive film 12 is a surface in the second conductive film 12 on a side opposite to a surface facing the surface 111 of the organic insulating film 10 and the upper surface 6A of the first conductive film 6. Inside the first through hole 21, the second conductive film 12 and the third conductive film 16 disposed at the surface of the second conductive film 12 function as a through electrode 100c.

In the present embodiment, the third conductive film 16 is made of copper. A material constituting the third conductive film 16 is not limited to copper. The material constituting the third conductive film 16 may be, for example, nickel or aluminum.

The method for manufacturing the semiconductor device 1c further includes the step of disposing the third conductive film 16 at the surface of the second conductive film 12 in addition to steps S1 to S8 shown in FIG. 2. In the following description, the step of disposing the third conductive film 16 at the surface of the second conductive film 12 may be referred to as a "third conductive film disposing step".

The third conductive film disposing step is performed after step S8.

In the third conductive film disposing step, the third conductive film 16 is disposed at the surface of the second conductive film 12.

In the present embodiment, in the third conductive film disposing step, the third conductive film 16 is formed by using a plating method. A method for forming the third conductive film 16 is not limited to the plating method. For example, the third conductive film 16 may be formed by using a sputtering method.

In the present embodiment, by disposing the third conductive film 16 at the surface of the second conductive film 12, the second conductive film 12 and the third conductive film 16 disposed at the surface of the second conductive film 12 function as the through electrode 100c inside the first through hole 21. Electrical coupling of the second conductive film 12 may become unstable when coverage of the second conductive film 12 formed in step S8 is low, but reliability of the through electrode 100c is improved by reinforcing the coverage of the second conductive film 12 with the third conductive film 16.

As described above, according to the present embodiment, the following effects can be obtained in addition to the effects of the first embodiment.

According to the present embodiment, the second conductive film 12 and the third conductive film 16 can function as the through electrode 100c inside the first through hole 21 by disposing the third conductive film 16 at the surface of the second conductive film 12.

Accordingly, reliability of electrical coupling in the through electrode 100c is improved.

As described above, the method for manufacturing a semiconductor device according to the present disclosure has been described based on the embodiments. However, the present disclosure is not limited thereto, and a configuration of each unit can be replaced with any configuration having the same function. In addition, any other components may be added to the present disclosure. In addition, the embodiments may be appropriately combined.

What is claimed is:

1. A method for manufacturing a semiconductor device, comprising:
   disposing a first insulating film and a first conductive film in this order at a second surface of a semiconductor substrate having a first surface and the second surface;
   forming a first through hole penetrating from the first surface to the second surface of the semiconductor substrate to expose the first insulating film disposed at the second surface from the first through hole;
   forming a second insulating film at the first surface of the semiconductor substrate and a side surface of the first through hole;
   disposing a resist at a surface of the second insulating film from the first surface of the semiconductor substrate to an end portion of the side surface of the first through hole on a first surface side of the semiconductor substrate;
   wet-etching the first insulating film and the second insulating film by using the resist as a mask and forming a second through hole continuous with the first through hole in the first insulating film;
   covering the first surface of the semiconductor substrate, the side surface of the first through hole, a side surface of the second through hole, and a surface of the first conductive film exposed from the second through hole with an organic insulating film;
   forming an opening for exposing the first conductive film in the organic insulating film; and
   forming a second conductive film at a surface of the organic insulating film and the surface of the first conductive film exposed from the opening formed in the organic insulating film.

2. The method for manufacturing a semiconductor device according to claim 1, wherein
   forming the opening for exposing the first conductive film in the organic insulating film includes forming the surface of the organic insulating film in a tapered shape that gradually narrows from the first surface toward the second surface inside the first through hole.

3. The method for manufacturing a semiconductor device according to claim 1, wherein
   the organic insulating film is made of a positive photosensitive resin, and
   forming the opening for exposing the first conductive film in the organic insulating film includes exposing and developing a portion of the organic insulating film corresponding to the opening from the first surface side of the semiconductor substrate to form the opening.

4. The method for manufacturing a semiconductor device according to claim 1, further comprising:
   burying a metal material in a recess surrounded by the second conductive film.

5. The method for manufacturing a semiconductor device according to claim 1, further comprising:
   disposing a third conductive film at a surface of the second conductive film.

* * * * *